United States Patent
Kim et al.

(10) Patent No.: US 8,865,519 B2
(45) Date of Patent: Oct. 21, 2014

(54) METHOD OF MANUFACTURING SILICON CARBIDE STRUCTURE

(75) Inventors: Joung Il Kim, Gyeonggi-do (KR); Jae Seok Lim, Gyeonggi-do (KR); Mi-Ra Yoon, Gyeonggi-do (KR)

(73) Assignee: Tokai Carbon Korea Co., Ltd., Gyeonggi-Do (KR)

( * ) Notice: Subject to any disclaimer, the term of this patent is extended or adjusted under 35 U.S.C. 154(b) by 137 days.

(21) Appl. No.: 13/609,622

(22) Filed: Sep. 11, 2012

(65) Prior Publication Data

US 2013/0168697 A1    Jul. 4, 2013

(30) Foreign Application Priority Data

Dec. 29, 2011  (KR) .................. 10-2011-0145513

(51) Int. Cl.
*H01L 21/02*    (2006.01)

(52) U.S. Cl.
USPC .............................................. 438/105

(58) Field of Classification Search
CPC ............. H01L 2924/01079; H01L 23/0262; H01L 21/02381
USPC ................................ 438/105, 931
See application file for complete search history.

(56) References Cited

U.S. PATENT DOCUMENTS 7,022,545 B2    4/2006  Yamada et al.
2013/0320356 A1*  12/2013  Torabi et al. ............. 257/77

FOREIGN PATENT DOCUMENTS

KR  10-2004-0080004 B1  9/2004
KR  10-2009-0081137 A   7/2009

* cited by examiner

*Primary Examiner* — (Vikki) Hoa B Trinh
(74) *Attorney, Agent, or Firm* — Leydig, Voit & Mayer, Ltd.

(57) ABSTRACT

A method of manufacturing a silicon carbide structure includes forming a silicon carbide layer by depositing silicon carbide on a base plate by chemical vapor deposition, removing the base plate, decreasing electrical conductivity by heat-treating the silicon carbide structure, and removing a thickness of 200 μm from an upper surface and a lower surface of the silicon carbide structure. In the present invention, silicon carbide is deposited by a CVD method, and the electrical conductivity of the silicon carbide is reduced to the electrical conductivity required for a protection ring of a plasma device through a post-treatment and a post-process. The electrical conductivity may be adjusted even without using separate additives.

4 Claims, 3 Drawing Sheets

HEAT-TREATMENT

200um OR LARGER

BEFORE HEAT-TREATMENT

AFTER HEAT-TREATMENT

METHOD OF MANUFACTURING SILICON CARBIDE STRUCTURE

CROSS-REFERENCE TO RELATED APPLICATION

This application claims priority to and the benefit of Korean Patent Application No. 10-2011-0145513, filed on 29 Dec., 2011, the disclosure of which is incorporated herein by reference in its entirety.

BACKGROUND

1. Field of the Invention

The present invention relates to a silicon carbide structure and a manufacturing method thereof, and more particularly, to a silicon carbide structure that can adjust electrical conductivity, and a manufacturing method thereof.

2. Discussion of Related Art

In recent years, as a material applied to devices for manufacturing a light emitting diode (LED), interest on silicon carbide (SiC) with excellent chemical resistance, abrasion resistance, and heat resistance has been increased. In particular, chemical and physical properties of chemical vapor deposition (CVD) SiC that is deposited and formed using a CVD method has been known to be highly desirable as a component of the manufacturing device.

Due to these properties, there have been efforts to apply SiC to a device for manufacturing a semiconductor or a device for manufacturing an LED. In particular, SiC may be applied to a protection ring of a plasma etching device or a plasma CVD device that can form a fine circuit pattern on a semiconductor wafer.

The components of the device for manufacturing the semiconductor described above require desirable electrical conductivity, high purity, high corrosion resistance, and uniformity. In particular, the protection ring should have low electrical conductivity so as to evenly perform etching in the wafer, but the electrical conductivity of SiC that is deposited purely using the CVD method is significantly higher than electrical conductivity required for the protection ring.

As a method for adjusting electrical conductivity of silicon carbide ceramics, a method of using, for example, beryllium, beryllium carbide, beryllium oxide, or nitrogen boron as sintering aids has been suggested from "Silicon Carbide Ceramics", Uchida Roukakuho, p. 327.

However, the above-suggested method is an example of manufacturing SiC by a sintering method that has a difference in characteristics with the SiC deposited by the CVD method, and has a problem that high purity SiC cannot be obtained because other ingredients are mixed.

In addition, the added beryllium, beryllium carbide, beryllium oxide, or nitrogen boron may be detected as foreign substances when being applied to the above-described plasma device.

In addition, in the SiC that is deposited and manufactured in the CVD method, a high electron concentration is provided due to defects that may occur at the time of deposition, and electron mobility of the defective portions is smoothly achieved, and therefore electrical conductivity is higher than that of sintering SiC. Such CVD SiC has a problem that there is a limitation when reducing electrical conductivity by addition of additives.

SUMMARY OF THE INVENTION

The present invention is directed to a silicon carbide structure that may fabricate pure SiC (SiC being at least 99.9%) in a CVD method and reduce electrical conductivity of the pure SiC, and a manufacturing method thereof.

According to an aspect of the present invention, there is provided a silicon carbide structure that is deposited by a chemical vapor deposition method, and formed of silicon carbide with an electrical conductivity of $10^{-3}$ S/cm or less.

According to another aspect of the present invention, there is provided a method of manufacturing a silicon carbide structure, including: forming a silicon carbide layer by depositing silicon carbide on a base plate using a chemical vapor deposition method; acquiring a silicon carbide structure formed of the silicon carbide by removing the base plate; decreasing electrical conductivity by heat-treating the silicon carbide structure; and removing a thickness of 200 μm or greater by processing an upper surface and a lower surface of the silicon carbide structure.

DETAILED DESCRIPTION OF EXEMPLARY EMBODIMENTS

Exemplary embodiments of the present invention will be described in detail below with reference to the accompanying drawings.

Figure 1:
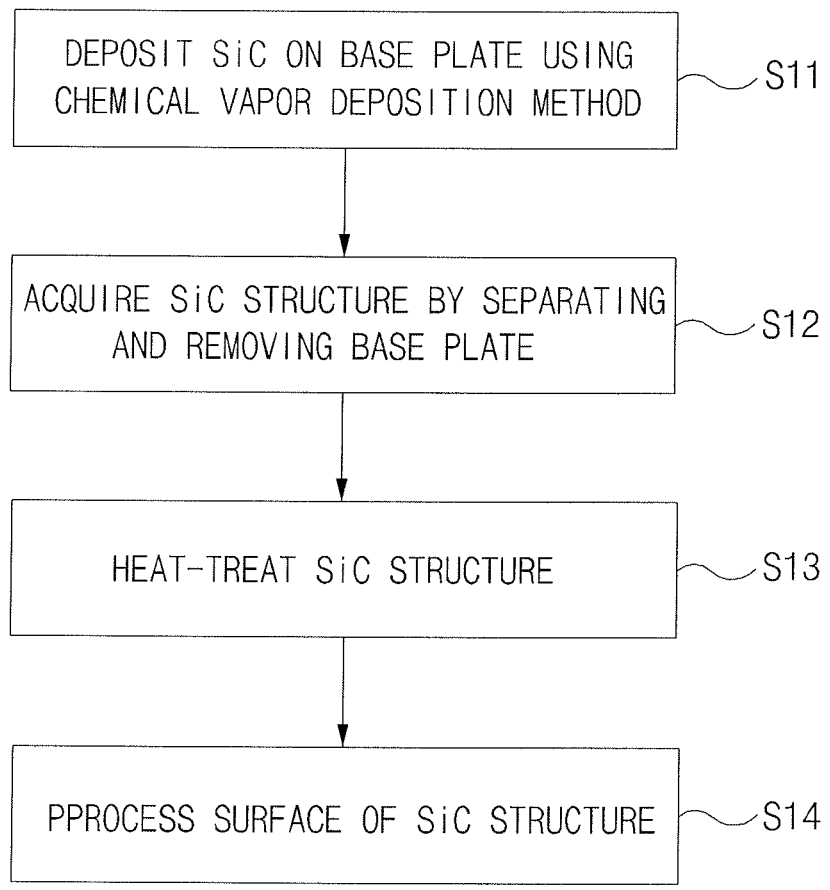
FIG. 1 is a flowchart of a method of fabricating SiC according a preferred embodiment of the present invention.

FIG. 1 is a flowchart of a method of fabricating SiC according a preferred embodiment of the present invention, and FIGS. 2 to 5 are cross sectional views showing a silicon carbide structure for each process of FIG. 1.

Referring to each of FIGS. 1 to 5, a method of fabricating silicon carbide according to a preferred embodiment of the present invention includes a deposition step S11 of depositing a SiC layer 2 on a disk-like base plate 1 in a chemical vapor deposition (CVD) method, a base plate removing step S12 for removing the base plate 1 to thereby acquire a pure SiC structure 3, a heat-treatment step S13 of heat-treating the SiC structure 3 in a heat-treatment furnace, and a post-processing step S14 of performing a post-process for removing an upper surface and a lower surface of the SiC structure 3 by a predetermined thickness so that the electrical conductivity becomes $10^{-3}$ S/cm or less.

Hereinafter, a specific configuration and operation of the manufacturing method of the silicon carbide according to a preferred embodiment of the present invention, which is configured as above, will be described in detail.

Figure 2:
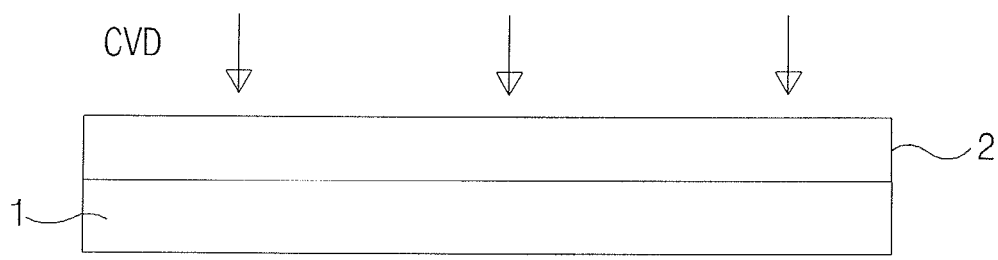
FIGS. 2 to 5 are cross sectional views showing a silicon carbide structure for each process of FIG. 1.

First, in step S11, as shown in FIG. 2, the SiC layer 2 is deposited on the base plate 1 in the chemical vapor deposition method. In this instance, SiC is pure SiC in which a content of SiC is at least 99.9%.

As a material of the base plate 1, a graphite material may be used, and particularly, any material may be used as long as the material is selectively removed due to a difference in mechanical or chemical characteristics with the SiC layer 2.

In FIG. 2, an example in which the SiC layer 2 is deposited only on an upper surface of the base plate 1 has been described, but the SiC layer 2 may be actually deposited on a lower surface and a side surface of the base plate 1 as well as the upper surface thereof. Here, for convenience of descriptions, the example in which the SiC layer 2 is deposited only on the upper surface of the base plate 1 will be described.

A method of separating the SiC that is deposited on the entire surface of the base plate 1 has been disclosed in Korean Patent Application No. 10-1001674 (filed on Dec. 9, 2010) by applicant of present invention.

In an embodiment of the present invention, an example in which a disk-like SiC structure is manufactured using the disk-like base plate 1 has been described, but obviously, a ring-like SiC structure may be easily manufactured using the SiC that is deposited on a side surface portion of the base plate 1.

A thickness of the deposited SiC layer 2 may be thicker compared to application of the SiC layer 2. This is based on a processing thickness of step S14, and the SiC layer 2 is deposited with a thickness of 400 μm or larger compared to at least application of the SiC layer 2.

Figure 3:

Next, as shown in step S12 and FIG. 3, the base plate 1 is separated or removed from a laminated structure of the base plate 1 and the SiC layer 2 to thereby acquire a SiC structure 3 including only the SiC layer 2.

In this instance, in the SiC structure 3, an electrical conductivity of an upper surface is $4.27 \times 10^{-3}$ S/cm, and an electrical conductivity of a lower surface is $4.29 \times 10^{-3}$ S/cm.

Figure 4:
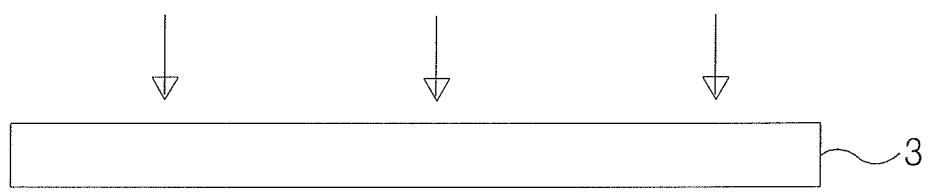

Next, as shown in step S13 and FIG. 4, the acquired SiC structure 3 is subjected to heat-treatment to remove defects in the SiC structure 3, thereby reducing electrical conductivity.

In this instance, a heat-treatment temperature is 1,500□ to 2,1000□, and a heat-treatment time is 5 to 100 hours, so that a crystal structure of the SiC structure 3 is rearranged to thereby remove internal defects of the SiC structure 3. In this instance, defects of a surface of the SiC structure 3 may be further increased, and the reason why the defects of the surface are increased will be described in detail later.

Figure 6:
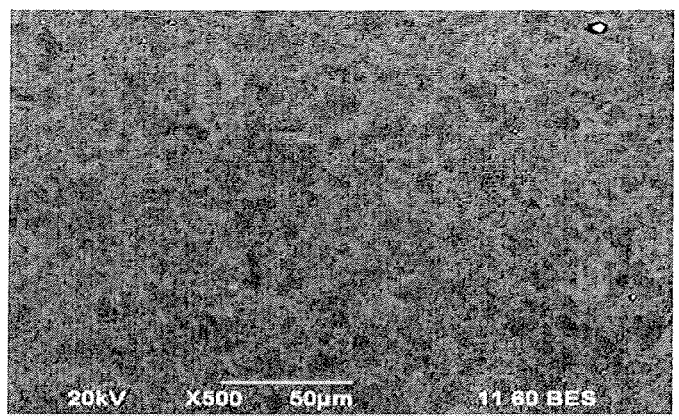
FIG. 6 is a surface photograph of a silicon carbide structure before and after heat treatment according to a preferred embodiment of the present invention.
Figure 6:
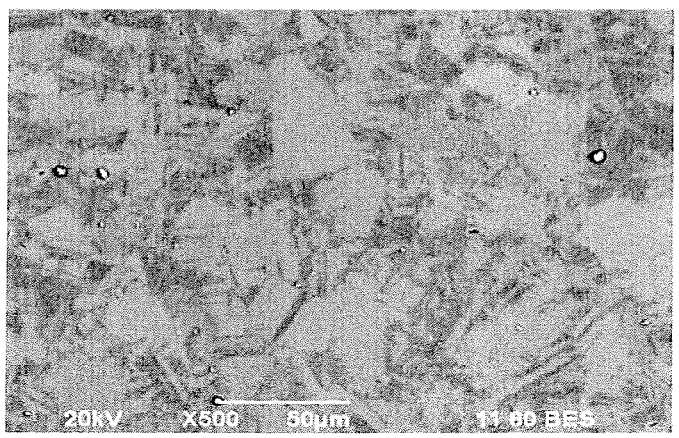

FIG. 6 is an electron micrograph showing a crystalline state of the SiC structure 3 before and after the heat-treatment.

Referring to FIG. 6, it can be found that of a size of a SiC crystal with a diameter of several μm before performing the heat-treatment is increased with a diameter of 20 μm to 100 μm after performing the heat-treated under the above-described condition, and this shows the fact that the crystal structure is changed and internal detects due to the change in the crystal structure is removed.

The heat-treatment may be performed in an inert gas atmosphere such as nitrogen, or argon, or in a vacuum.

Electrical conductivity of an upper surface of the SiC structure 3 that has been subjected to the heat-treatment in this manner becomes about $9.09 \times 10^{-2}$ S/cm. From this, it can be found that the entire electrical conductivity of the SiC structure 3 is reduced by the heat-treatment, but rather the electrical conductivity of the surface is more increased compared to before the process.

This is because defects on the surface of the SiC structure are increased as the SiC is changed to Si-rich or C-rich due to damages of SiC caused by heat, an electron concentration in the vicinity of the detects is increased, and mobility is increased.

The following Table 1 shows a change in electrical conductivity before and after the heat-treatment.

Referring to Table 1, although there are differences depending on sample pieces, the electrical conductivity is increased in a range of $3.105 \times 10^{-2}$ S/cm to $9.091 \times 10^{-2}$ S/cm.

TABLE 1

| | | Surface electrical conductivity S/cm | |
|---|---|---|---|
| Sample number | Sample name | Before heat-treatment | After heat-treatment |
| 1 | SAMPLE 1 | 6.398E−03 | 9.091E−02 |
| 2 | SAMPLE 2 | 2.587E−02 | 6.667E−02 |
| 3 | SAMPLE 3 | 2.434E−03 | 3.105E−02 |

From the above results, it can be found that there is a difference between the surface electrical conductivity of the heat-treated SiC structure 3 and the entire electrical conductivity thereof. That is, more defects occur on the surface of the SiC structure 3 than an inside thereof, and therefore the electrical conductivity of the surface is higher than that of the inside.

In this manner, the entire electrical conductivity including the electrical conductivity on the surface and the inside of the SiC structure 3 may be reduced by the heat-treatment, but the electrical conductivity cannot be reduced to a level that is applicable to a component of the plasma device requiring lower electrical conductivity characteristics due to the increase in the surface electrical conductivity. Therefore, the surface of the SiC structure 3 in which electrical conductivity is increased due to the heat-treatment is processed.

Figure 5:
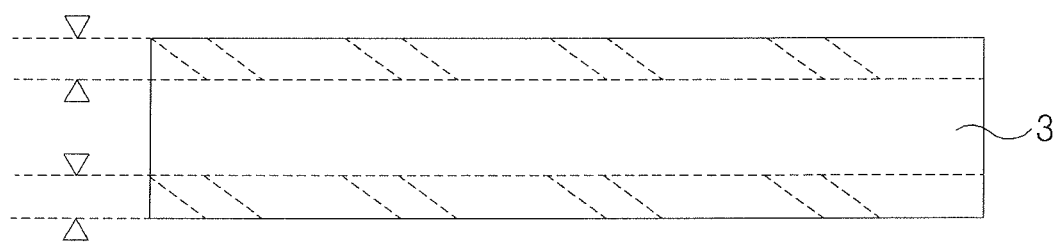

As shown in step S14 and FIG. 5, the upper surface and the lower surface of the SiC structure 3 are cut or abraded by a predetermined thickness to thereby be removed.

As described above, when heat-treating SiC that is deposited by the CVD method, defects are increased as SiC is changed to Si-rich or C-rich due to damages of the surface of SiC caused by heat, and therefore the electrical conductivity on the surface is relatively higher than the electrical conductivity on the inside.

In this manner, the entire electrical conductivity of the SiC structure 3 may be further reduced by removing the surface portion of SiC with high electrical conductivity.

A surface processing thickness of the SiC structure 3 may be a minimum of 200 μm to a maximum of 1,500 μm. When the surface of the SiC structure 3 is processed to have 200 μm or less, the detects cannot be completely removed to thereby show less reduction effect of the electrical conductivity, and when the surface of the SiC structure 3 is processed to have 1,500 μm or larger, a low reduction ratio of the electrical conductivity is shown, and the process is difficult to be performed.

The electrical conductivity of the SiC structure 3 processed in this manner is $10^{-3}$ to $10^{-6}$ S/cm.

The following Table 2 shows electrical conductivities of the upper surface and the lower surface of the SiC structure 3 which are measured for each step of the present invention.

TABLE 2

| | After removing base plate | After heat-treatment | First upper surface process Total amount of process (200 μm) | First lower surface process Total amount of process (400 μm) | Second upper surface process Total amount of process (600 μm) | Second lower surface process Total amount of process (800 μm) | Third upper surface process Total amount of process (1,000 μm) | Third lower surface process Total amount of process (1,240 μm) |
|---|---|---|---|---|---|---|---|---|
| Electrical conductivity of upper surface | 4.27E−03 | 9.09E−02 | 8.76E−04 | 2.29E−04 | 2.24E−04 | 1.57E−04 | 1.50E−04 | 8.86E−05 |

TABLE 2-continued

|  | After removing base plate | After heat-treatment | First upper surface process Total amount of process (200 μm) | First lower surface process Total amount of process (400 μm) | Second upper surface process Total amount of process (600 μm) | Second lower surface process Total amount of process (800 μm) | Third upper surface process Total amount of process (1,000 μm) | Third lower surface process Total amount of process (1,240 μm) |
|---|---|---|---|---|---|---|---|---|
| Electrical conductivity of lower surface | 4.29E−03 | 3.85E−02 | 3.11E−02 | 3.20E−04 | 2.79E−04 | 1.65E−04 | 1.55E−04 | 1.46E−04 |

In the Table 2, units are omitted, and a unit of the electrical conductivity is S/cm. Although there are differences depending on samples, it can be found that, based on results obtained by measuring electrical conductivity of the upper surface and the lower surface of the SiC structure 3 of the prepared samples before and after the heat-treatment and during the post-process, the electrical conductivity of the surface after the heat-treatment was a unit of $10^{-2}$, but the electrical conductivity of the surface was reduced to units of $10^{-4}$ to $10^{-5}$ when the upper surface and the lower surface are processed.

Therefore, according to the embodiment of the present invention, the electrical conductivity of SiC deposited by the CVD method may be reduced through the heat-treatment, and the electrical conductivity may be further reduced by removing the surface by a predetermined thickness.

According to the embodiments of the present invention, silicon carbide is deposited by a CVD method to thereby be formed, and then electrical conductivity of the silicon carbide is reduced to electrical conductivity required for plasma application facilities through the post-treatment and the post-process, and therefore the electrical conductivity may be adjusted without using separate additives.

In addition, according to the embodiments of the present invention, since the separate additives are not used, foreign substances may not be generated, and the electrical conductivity may be adjusted without a reduction in the physical and chemical characteristics of pure SiC (SiC being at least 99.9%).

While the present invention is shown and described in detail in connection with exemplary embodiments thereof, it will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of manufacturing a silicon carbide structure, comprising:
    forming a silicon carbide layer on a base plate by chemical vapor deposition;
    removing the base plate and leaving a silicon carbide structure;
    heat-treating the silicon carbide structure and decreasing electrical conductivity of the silicon carbide structure; and
    removing a thickness of at least 200 μm from an upper surface and from a lower surface of the silicon carbide structure.

2. The method of manufacturing the silicon carbide structure of claim 1, including heat-treating in an inert gas ambient at a temperature of 1,500° C. to 2,100° C. for 5 to 100 hours.

3. The method of manufacturing the silicon carbide structure of claim 2, including removing thicknesses of at least 200 μm from a surface of the silicon carbide structure by cutting or abrading.

4. The method of manufacturing the silicon carbide structure of claim 1, including removing thicknesses of at least 200 μm from a surface of the silicon carbide structure by cutting or abrading.

* * * * *